US012575455B2

(12) United States Patent
He et al.

(10) Patent No.: US 12,575,455 B2
(45) Date of Patent: Mar. 10, 2026

(54) MICRO LIGHT EMITTING DIODE

(71) Applicant: RAYLEIGH VISION LIMITED, Kowloon (HK)

(72) Inventors: Jr-Hau He, Hsinchu (TW); Zhi-Ting Ye, Miaoli County (TW); Chun-Wei Tsai, New Taipei (TW); Der-Hsien Lien, Taipei (TW); Yuk-Tong Cheng, Kowloon (HK)

(73) Assignee: RAYLEIGH VISION INTELLIGENCE CO. LTD., Hsinchu (TW)

( * ) Notice: Subject to any disclaimer, the term of this patent is extended or adjusted under 35 U.S.C. 154(b) by 379 days.

(21) Appl. No.: 18/239,330

(22) Filed: Aug. 29, 2023

(65) Prior Publication Data
US 2025/0079422 A1      Mar. 6, 2025

(51) Int. Cl.
*H01L 25/16*      (2023.01)
*H10H 20/831*      (2025.01)
*H10H 29/10*      (2025.01)

(52) U.S. Cl.
CPC ......... *H01L 25/167* (2013.01); *H10H 20/831* (2025.01); *H10H 29/10* (2025.01)

(58) Field of Classification Search
None
See application file for complete search history.

(56) References Cited

U.S. PATENT DOCUMENTS

| | | | |
|---|---|---|---|
| 9,076,929 B2 * | 7/2015 | Katsuno | H10H 20/8312 |
| 10,170,666 B2 * | 1/2019 | Cha | H10H 20/855 |
| 11,552,061 B2 * | 1/2023 | Chae | H10H 20/0137 |
| 2004/0129944 A1 * | 7/2004 | Chen | H01L 25/0756 257/89 |
| 2018/0156965 A1 * | 6/2018 | El-Ghoroury | G09G 3/2003 |
| 2019/0164944 A1 * | 5/2019 | Chae | H01L 25/13 |
| 2019/0189681 A1 * | 6/2019 | Chae | H10H 20/857 |

* cited by examiner

*Primary Examiner* — Nishath Yasmeen
(74) *Attorney, Agent, or Firm* — WPAT, PC

(57)      ABSTRACT
A micro light emitting diode (LED) is provided. The micro LED includes a first light emitting unit and a second light emitting unit disposed on a top of the first light emitting unit. A first electrode of the first light emitting unit is inserted through a groove of the second light emitting unit and electrically connected with a substrate. A third light emitting unit is either shielded by the first light emitting unit or arranged at one side of the first light emitting unit. The first light emitting unit, the second light emitting unit, and the third light emitting unit are connected with a common connection point of the substrate by respective common electrodes. Thus an area of a light emitting surface of the micro LED is further reduced.

10 Claims, 6 Drawing Sheets

1

MICRO LIGHT EMITTING DIODE

FIELD OF THE INVENTION

The present invention relates to a micro light emitting diode (LED), especially to a micro LED with vertically stacked structure.

BACKGROUND OF THE INVENTION

Micro light-emitting diode (LED) is an emerging display technology consisting of tiny light emitting chips. Compared with LED or OLED (organic light emitting diode) display technology available now, the micro LED provides not only higher brightness, higher contrast ratio, and greater color performance, but also better efficiency and longer lifetime.

The micro LED has huge advantages over other display technologies. First are brightness and contrast. The brightness of micro LED can be up to 10 times of the general OLED and the contrast is also higher. Thereby the micro LED display has significant improvement on color reproduction and image quality.

The second advantage of the micro LED is color performance. Since the micro LED display uses pure light source, it shows a wider color gamut, making colors more real and vivid. At the same time, the micro LED display enables local dimming which means brightness adjustment at individual zones of the same screen. Thereby better contrast ratio and higher efficiency are achieved.

The third advantage is regrading efficiency and longer lifetime. The micro LED uses pure light sources so that backlight and color filter are not required. The light-extraction efficiency is improved.

Owing to the advantages mentioned above, the micro LED has become first choice for many high-end display products including smart phones, tablets, televisions, virtual reality (VR)/augmented reality (AR) helmet, car dashboard displays, etc.

With increasing demands for displays with better quality and high resolution, the micro LED technology is getting more and more attention. Compared with conventional liquid crystal displays, LED displays, and OLED displays, the micro LED display is considered as the next generation of display technology because of its higher brightness, better contrast ratio, and a wider color space.

The advantages of the micro LED are also reflected in reliability and long-term cost. The micro LED has long lifetime and high durability so that it's more economical than other technologies. Moreover, the micro LED maintains high quality display for a long time because of its low power consumption and long service time, without much maintenance and replacement of parts.

However, an area of the conventional micro LED is difficult to be minimized due to parallel arrangement of red light LED, green light LED and blue light LED. In order to meet a requirement for more compact design of electronic products, manufacturers need a micro LED with an effectively-reduced area of light emitting surface.

In order to solve the problems of the conventional technique mentioned above, a micro LED is provided by the present invention. The micro LED is formed by two LED stacked vertically and another LED. A semiconductor layer of the respective LEDs is connected to a substrate by a common electrode to reduce an area of a light emitting surface of the whole micro LED.

SUMMARY

Therefore, it is a primary object of the present invention to provide a micro LED which includes two light emitting diodes (LEDs) stacked vertically and another LED. A semiconductor layer of the respective LEDs is connected to a substrate by a common electrode. Thereby an area of a light emitting surface of the micro LED is reduced.

In order to achieve the above object, a micro light emitting diode (LED) according to the present invention includes a first light emitting unit, a second light emitting unit, a third light emitting unit, and a substrate. The first light emitting unit consists of a first lower semiconductor layer, a first light emitting layer disposed on a top of the first lower semiconductor layer and emitting a first light ray, a first upper semiconductor layer arranged at a top of the first light emitting layer, a first reflective layer mounted on a top of the first upper semiconductor layer, a first passivation layer disposed on a top of the first reflective layer and covering the first upper semiconductor layer, a first electrode inserted through the first passivation layer and the first reflective layer and electrically connected with the first upper semiconductor layer, and a first common electrode inserted through the first passivation layer and electrically connected with the first lower semiconductor layer. The second light emitting unit is composed of a second lower semiconductor layer disposed on a top of the first passivation layer and provided with a groove in which the first electrode is mounted and located at an inner side thereof, a second light emitting layer arranged at a top of a part of the second lower semiconductor layer and emitting a second light ray, a second upper semiconductor layer mounted on a top of the second light emitting layer, a second reflective layer arranged at a top of the second upper semiconductor layer, a second passivation layer disposed on a top of the second reflective layer and covering one side of the second upper semiconductor layer and the other part of the second lower semiconductor layer, a second electrode inserted through the second passivation layer and the second reflective layer and electrically connected with the second upper semiconductor layer, and a second common electrode inserted through the second passivation layer and electrically connected with the second lower semiconductor layer. The third light emitting unit includes a third lower semiconductor layer located above the second passivation layer with an interval therebetween, a third light emitting layer disposed on a top of the third lower semiconductor layer and emitting a third light ray, a third upper semiconductor layer mounted on a top of the third light emitting layer, a third electrode electrically connected with the third upper semiconductor layer, and a third common electrode electrically connected with the third lower semiconductor layer. The substrate is provided with a first connection point, a second connection point, a third connection point, and a common connection point all disposed on a bottom of the substrate and spaced apart from one another. The first connection point, the second connection point, and the third connection point are respectively electrically connected with the second electrode, the first electrode, and the third electrode while the common connection point is electrically connected with the first common electrode, the second common electrode, and the third common electrode. The third light emitting unit is disposed on one side of the first light emitting unit and the common connection point is arranged above the first light emitting unit. Thereby an area of light emitting surface of the micro LED is further reduced according to the above structure.

In order to achieve the above object, a micro light emitting diode (LED) according to the present invention includes a first light emitting unit, a second light emitting unit, a common electrode, a third light emitting unit, and a substrate. The first light emitting unit consists of a first lower semiconductor layer, a first light emitting layer disposed on a top of the first lower semiconductor layer and emitting a first light ray, a first upper semiconductor layer arranged at a top of the first light emitting layer, a first reflective layer mounted on a top of the first upper semiconductor layer, a first passivation layer disposed on a top of the first reflective layer and covering the first upper semiconductor layer, and a first electrode inserted through the first passivation layer and the first reflective layer and electrically connected with the first upper semiconductor layer. The second light emitting unit is composed of a second lower semiconductor layer disposed on a top of the first passivation layer and provided with a groove in which the first electrode is mounted and located at an inner side thereof, a second light emitting layer arranged at a top of a part of the second lower semiconductor layer and emitting a second light ray, a second upper semiconductor layer mounted on a top of the second light emitting layer, a second reflective layer arranged at a top of the second upper semiconductor layer, a second passivation layer disposed on a top of the second reflective layer and covering one side of the second upper semiconductor layer and the other part of the second lower semiconductor layer, and a second electrode inserted through the second passivation layer and the second reflective layer and electrically connected with the second upper semiconductor layer. The common electrode is electrically connected with the first lower semiconductor layer and the second lower semiconductor layer. The third light emitting unit includes a third lower semiconductor layer located above the second passivation layer with an interval therebetween and electrically connected with the common electrode, a third light emitting layer disposed on a top of the third lower semiconductor layer and emitting a third light ray, and a third upper semiconductor layer mounted on a top of the third light emitting layer. The substrate includes a first connection point, a second connection point, a third connection point, and a common connection point all disposed on a bottom of the substrate and spaced apart from one another. The first connection point, the second connection point, the third connection point, and the common connection point are respectively electrically connected with the second electrode, the first electrode, the third upper semiconductor layer, and the common electrode. The third light emitting unit is disposed above the first light emitting unit so that the third light ray is passed through the first light emitting unit. Thereby an area of light emitting surface of the micro LED is further reduced according to the above structure.

Preferably, a transparent substrate is arranged at a bottom of the first lower semiconductor layer.

Preferably, the first light ray is red light, green light, or blue light.

Preferably, the second light ray is red light, green light, or blue light.

Preferably, the third light ray is red light, green light, or blue light.

DETAILED DESCRIPTION

In order to learn features and functions of the present invention more clearly, please refer to the following embodiments and detailed descriptions.

In order to solve the above problems of the conventional technique, a micro light emitting diode (LED) according to the present invention includes a second light emitting unit stacked above a first light emitting unit and the two light emitting units are respectively electrically connected with a substrate by respective electrodes correspondingly. A third light emitting unit is mounted on the substrate and electrically connected with the substrate by an electrode. The first light emitting unit, the second light emitting unit, and the third light emitting unit are connected with the same connection point of the substrate by respective common electrodes. The third light emitting unit is either disposed between the substrate and the first light emitting unit or arranged at one side of the first light emitting unit. Thereby the problem of difficulty in area reduction of the conventional micro LED is solved by the above structure.

Figure 1:
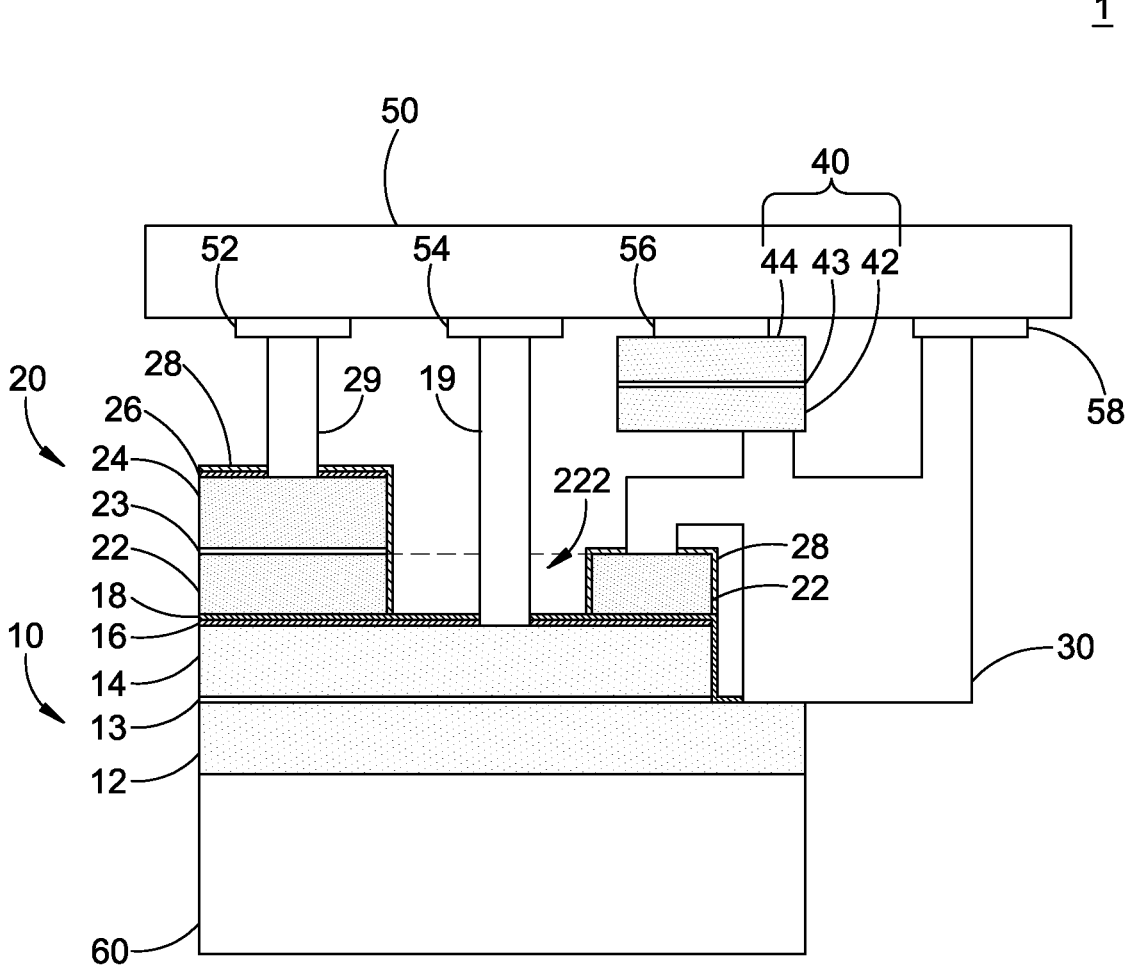
FIG. 1 is a schematic drawing showing structure of a first embodiment according to the present invention.

Refer to FIG. 1, a schematic drawing showing structure of a first embodiment of the present invention is provided. As shown in FIG. 1, a micro light emitting diode (LED) 1 according to the present invention includes a first light emitting unit 10, a second light emitting unit 20, a common electrode 30, a third light emitting unit 40, and a substrate 50.

Figure 2:
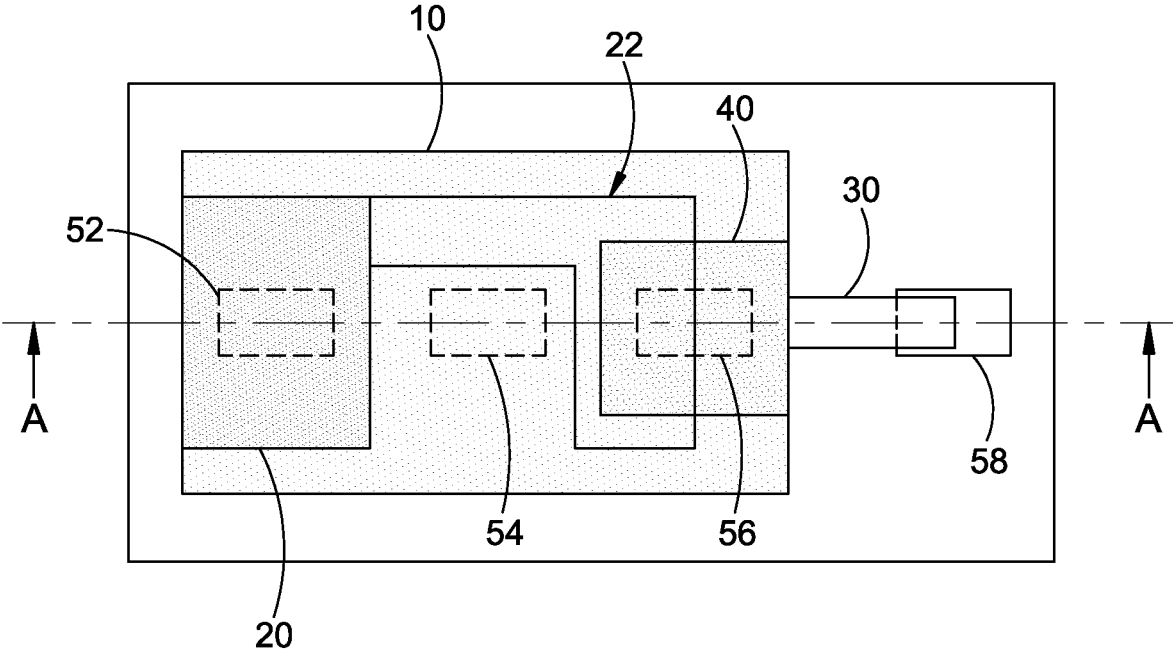
FIG. 2 is a top view showing structure a first embodiment according to the present invention.
Figure 3:
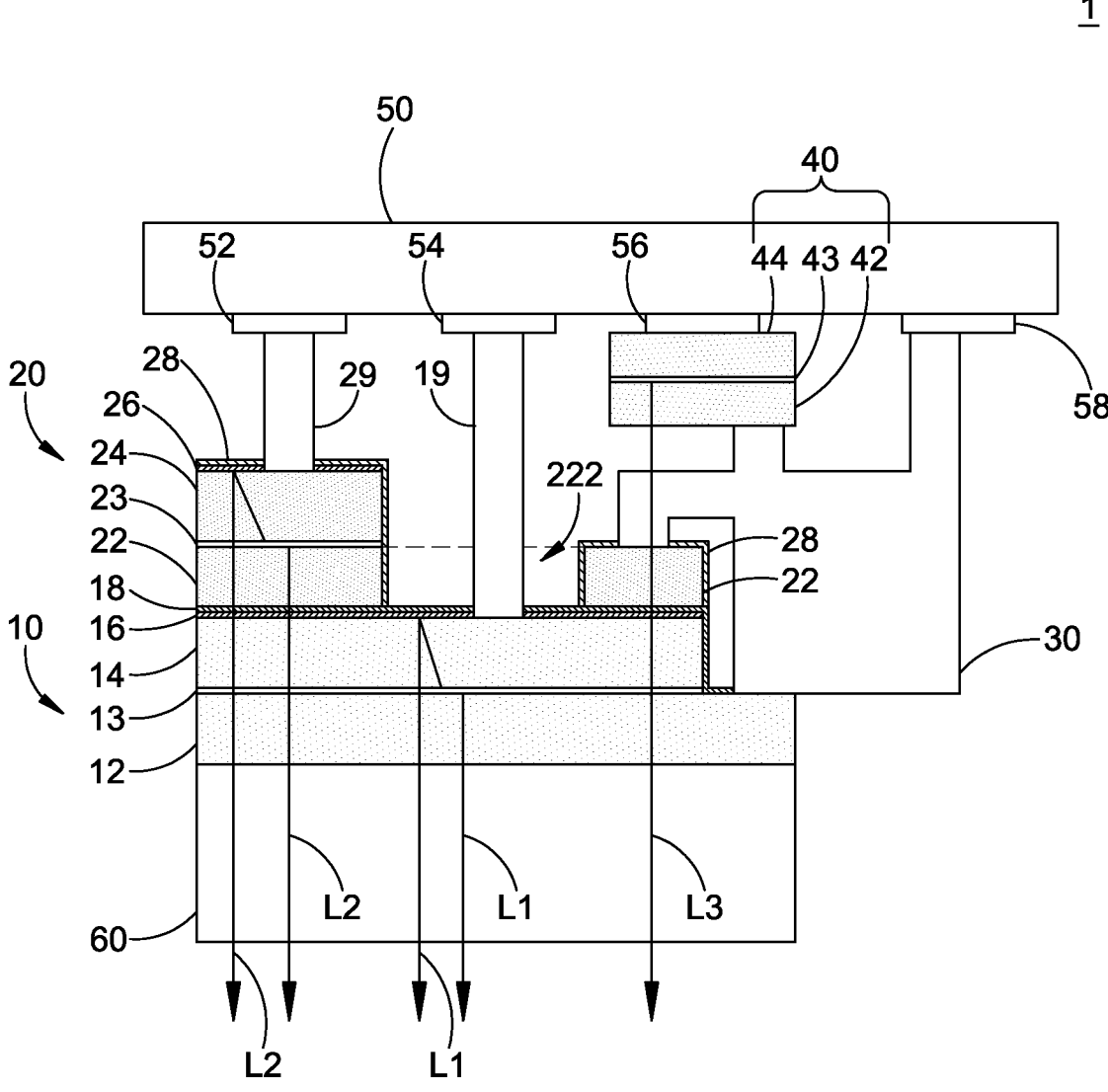
FIG. 3 is a schematic drawing showing light paths of a first embodiment according to the present invention.

Refer to FIG. 1, FIG. 2, and FIG. 3 which are respectively a sectional view along a line AA in FIG. 2, a top view, and a schematic drawing showing light paths of the first embodiment, the first light emitting unit 10 consists of a first lower semiconductor layer 12, a first light emitting layer 13, a first upper semiconductor layer 14, a first reflective layer 16, a first passivation layer 18, and a first electrode 19. The first light emitting layer 13 is disposed on a top of the first lower semiconductor layer 12 and emitting a first light ray L1 while the first upper semiconductor layer 14 is arranged at a top of the first light emitting layer 13 and the first reflective layer 16 is mounted on a top of the first upper semiconductor layer 14. The first passivation layer 18 is disposed on a top of the first reflective layer 16 and covering the first upper semiconductor layer 14 while the first electrode 19 is inserted through the first passivation layer 18 and the first reflective layer 16 and electrically connected with the first upper semiconductor layer 14. In a preferred embodiment, the first passivation layer 18 is covering one side of the first reflective layer 16, one side of the first light emitting layer 13, and one side of the first lower semiconductor layer 12 correspondingly.

The second light emitting unit 20 is composed of a second lower semiconductor layer 22, a second light emitting layer 23, a second upper semiconductor layer 24, a second reflective layer 26, a second passivation layer 28, and a second electrode 29. The second lower semiconductor layer 22 is disposed on a top of the first passivation layer 18 and provided with a groove 222 which allows the first passivation layer 18 to be exposed while the first electrode 19 is arranged at an inner side of the groove 222 and electrically connected with the first upper semiconductor layer 14. The second light emitting layer 23 is disposed on a top of a part of the second lower semiconductor layer 22 and emitting a second light ray L2 while the second upper semiconductor layer 24 is mounted on a top of the second light emitting layer 23 and the second reflective layer 26 is arranged at a top of the second upper semiconductor layer 24. The second passivation layer 28 is disposed on a top of the second reflective layer 26 and covering one side of the second upper semiconductor layer 24 and the other part of the second lower semiconductor layer 22 while the second electrode 29 is inserted through the second passivation layer 28 and the second reflective layer 26 and electrically connected with the second upper semiconductor layer 24. In this embodiment, the second passivation layer 28 is covering one side of the second reflective layer 26 and one side of the second light emitting layer 23 correspondingly. In this embodiment, the second lower semiconductor layer 22 is extending while the second light emitting layer 23 and the second upper semiconductor layer 24 are not extending correspondingly so as to form the groove 222 (as shown in FIG. 2) of the second lower semiconductor layer 22.

The common electrode 30 is electrically connected with the first lower semiconductor layer 12 and the second lower semiconductor layer 22. As to the third light emitting unit 40, it includes a third lower semiconductor layer 42, a third light emitting layer 43, and a third upper semiconductor layer 44. The third lower semiconductor layer 42 is located above the second passivation layer 28 with an interval therebetween and electrically connected with the common electrode 30. The third light emitting layer 43 is disposed on a top of the third lower semiconductor layer 42 and emitting a third light ray L3 while the third upper semiconductor layer 44 is mounted on a top of the third light emitting layer 43. In this embodiment, the third lower semiconductor layer 42 is electrically connected with a top of the common electrode 30.

A first connection point 52, a second connection point 54, a third connection point 56, and a common connection point 58 are disposed on a bottom of the substrate 50 and spaced apart from one another. The first connection point 52, the second connection point 54, the third connection point 56, and the common connection point 58 are respectively electrically connected with the second electrode 29, the first electrode 19, the third upper semiconductor layer 44, and the common electrode 30. In this embodiment, the third light emitting unit 40 is located above the first light emitting unit 10 so that the third light ray L3 is passed through the first light emitting unit 10 (as shown in FIG. 3).

In this embodiment, the third light emitting unit 40 is a vertical electrode LED.

In this embodiment, due to the groove 222 formed due to extension of the second lower semiconductor layer 22, the second lower semiconductor layer 22 is electrically connected with the common electrode 30 correspondingly and the common electrode 30 and the first electrode 19 will not interfere each other.

In a preferred embodiment, the first lower semiconductor layer 12, the second lower semiconductor layer 22, and the third lower semiconductor layer 42 are N-type semiconductor layers while the corresponding the first upper semiconductor layer 14, the second upper semiconductor layer 24, and the third upper semiconductor layer 44 are P-type semiconductor layers, but not limited.

In a preferred embodiment, the first lower semiconductor layer 12 is further provided with a transparent substrate 60 on a bottom thereof. The first light ray L1, the second light ray L2, and the third light ray L3 are respectively passed through the transparent substrate 60.

In this embodiment, the common electrode 30 is inserted through the first passivation layer 18 and the second passivation layer 28 to be electrically connected with the first lower semiconductor layer 12 and the second lower semiconductor layer 22.

Still refer to FIG. 1, FIG. 2, and FIG. 3, in this embodiment, the first light ray L1 is emitted from the first light emitting layer 13. A part of the first light ray L1 is passed through the first lower semiconductor layer 12 while the other part of the first light ray L1 is emitted to the first reflective layer 16 to be reflected by the first reflective layer 16 and then emitted from the first lower semiconductor layer 12. The second light emitting layer 23 emits the second light ray L2 and a part of the second light ray L2 is passed through the second lower semiconductor layer 22, the first passivation layer 18, the first reflective layer 16, the first upper semiconductor layer 14, the first light emitting layer 13, and the first lower semiconductor layer 12. The other part of the second light ray L2 is emitted to the second reflective layer 26 to be reflected by the second reflective layer 26 and then emitted from the first lower semiconductor layer 12. The third light emitting layer 43 emits the third light ray L3 which is passed through the second passivation layer 28, the second lower semiconductor layer 22, the first passivation layer 18, the first reflective layer 16, the first upper semiconductor layer 14, the first light emitting layer 13, and the first lower semiconductor layer 12. Thereby the third light ray L3 is emitted from the first lower semiconductor layer 12.

In this embodiment, the first light ray L1 is red light, green light, or blue light. Similarly, the second light ray L2 and the third light ray L3 are red light, green light or blue light. For example, the first light ray L1 is green light, the second light ray L2 is blue light, and the third light ray L3 is red light, but not limited.

In this embodiment, an area (light emitting surface) of the micro LED 1 is further reduced by fewer connection points.

Figure 4:
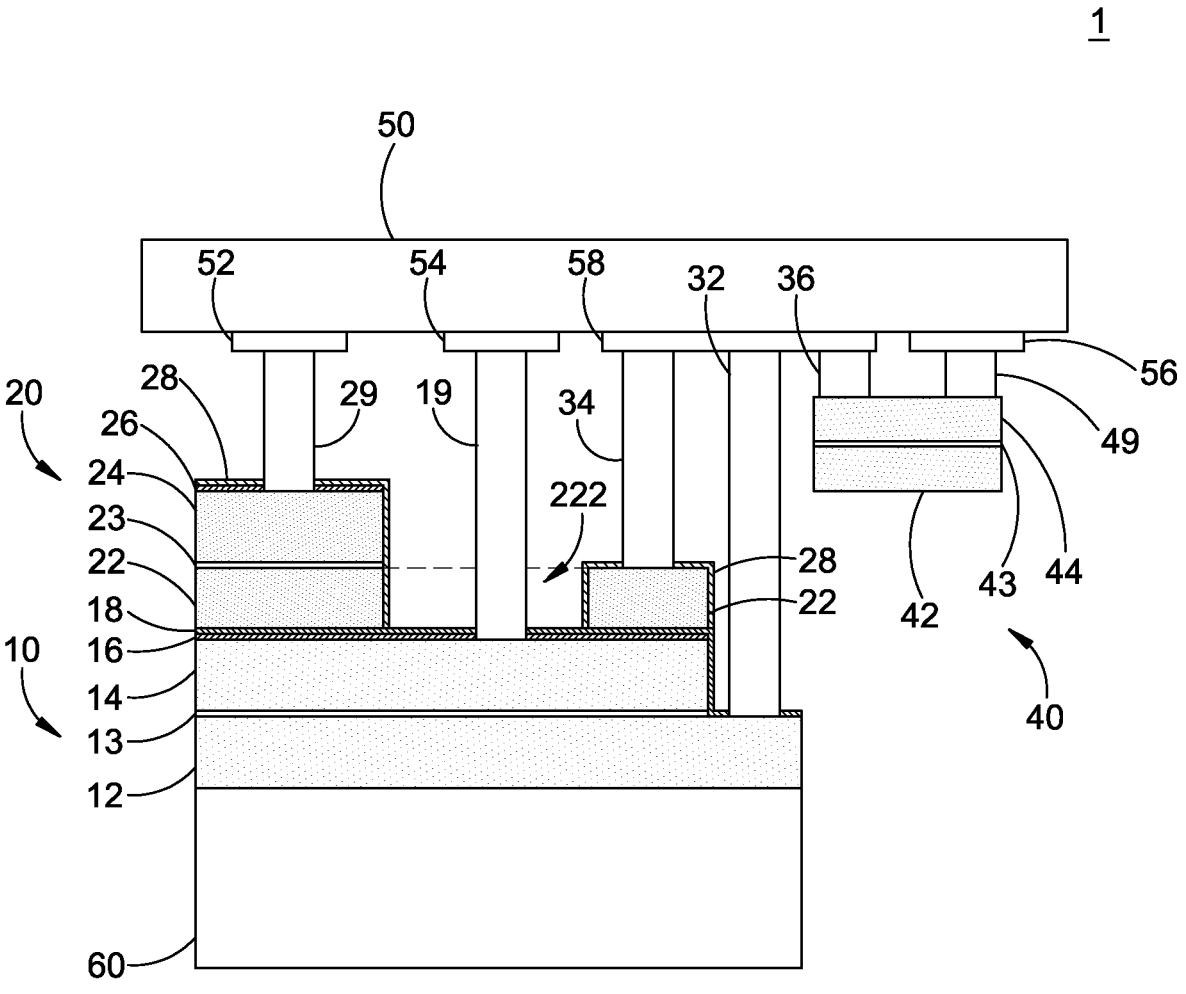
FIG. 4 is a schematic drawing showing structure of a second embodiment according to the present invention.

Refer to FIG. 4, a schematic drawing showing structure of a second embodiment according to the present invention is provided. As shown in the figure, in the second embodiment, a micro light emitting diode (LED) 1 includes a first light emitting unit 10, a second light emitting unit 20, a third light emitting unit 40, and a substrate 50.

Figure 5:
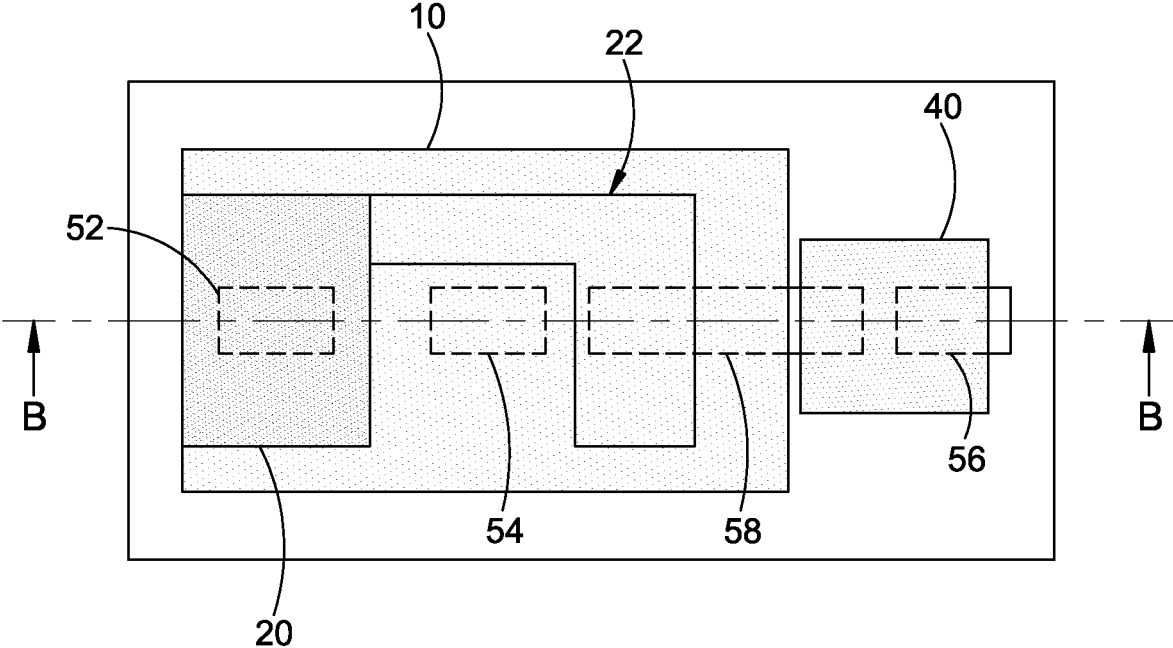
FIG. 5 is a top view showing structure a second embodiment according to the present invention.
Figure 6:
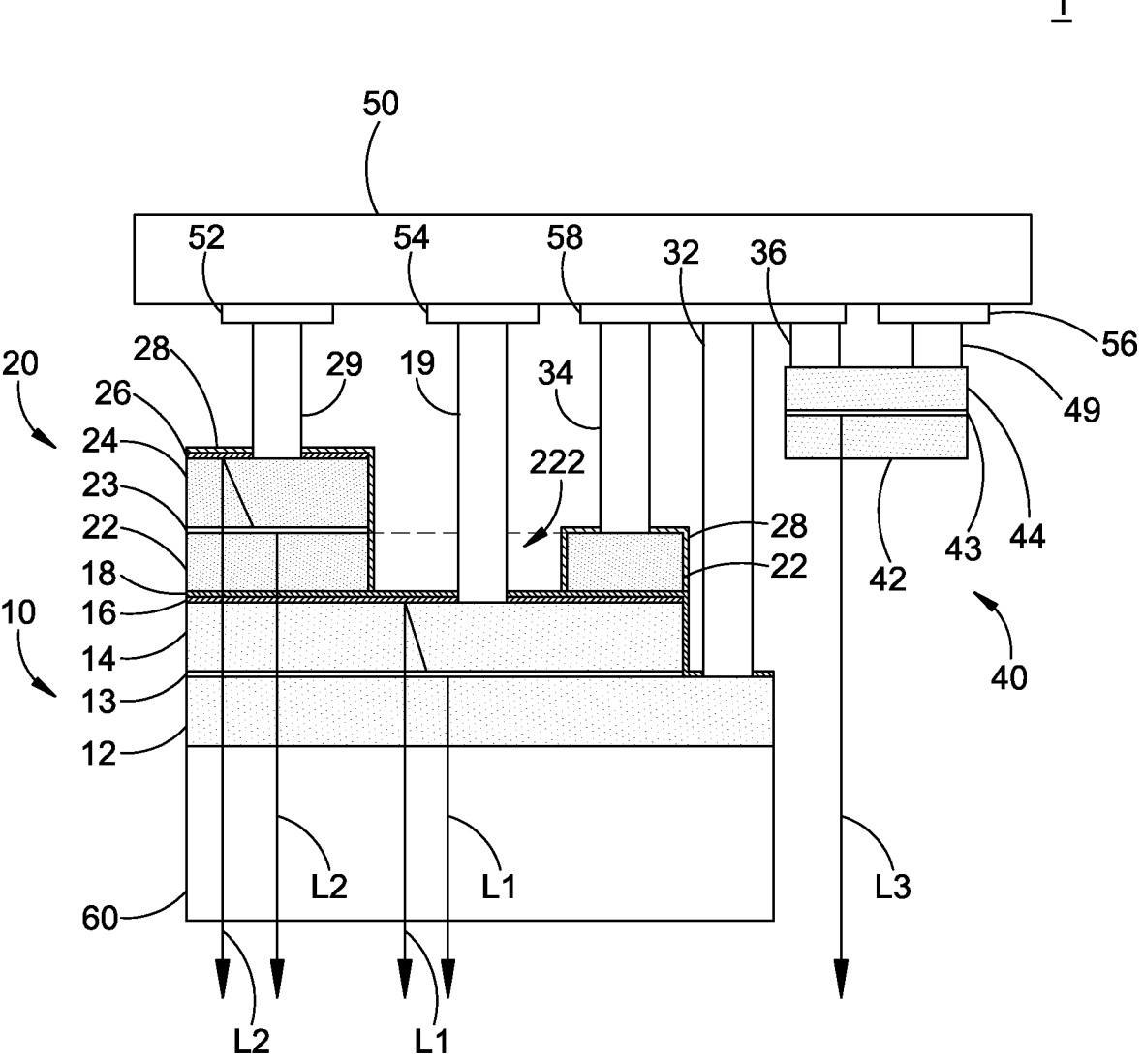
FIG. 6 is a schematic drawing showing light paths of a second embodiment according to the present invention.

Refer to FIG. 4, FIG. 5, and FIG. 6 which are respectively a sectional view along a line BB in FIG. 5, a top view, and a schematic drawing showing light paths of the second embodiment, the first light emitting unit 10 consists of a first lower semiconductor layer 12, a first light emitting layer 13, a first upper semiconductor layer 14, a first reflective layer 16, a first passivation layer 18, a first electrode 19, and a first common electrode 32. The first light emitting layer 13 is disposed on a top of the first lower semiconductor layer 12 and emitting a first light ray L1 while the first upper semiconductor layer 14 is arranged at a top of the first light emitting layer 13 and the first reflective layer 16 is mounted on a top of the first upper semiconductor layer 14. The first passivation layer 18 is disposed on a top of the first reflective layer 16 and covering the first upper semiconductor layer 14 while the first electrode 19 is inserted through the first passivation layer 18 and the first reflective layer 16 and electrically connected with the first upper semiconductor layer 14. In a preferred embodiment, the first passivation layer 18 is covering one side of the first reflective layer 16, one side of the first light emitting layer 13, and one side of the first lower semiconductor layer 12 correspondingly. The first common electrode 32 is inserted through the first passivation layer 18 and electrically connected with the first lower semiconductor layer 12.

The second light emitting unit 20 is composed of a second lower semiconductor layer 22, a second light emitting layer 23, a second upper semiconductor layer 24, a second reflective layer 26, a second passivation layer 28, a second electrode 29, and a second common electrode 34. The second lower semiconductor layer 22 is disposed on a top of the first passivation layer 18 and provided with a groove 222 which allows the first passivation layer 18 to be exposed while the first electrode 19 is arranged at an inner side of the groove 222 and electrically connected with the first upper semiconductor layer 14. The second light emitting layer 23 is disposed on a top of a part of the second lower semiconductor layer 22 and emitting a second light ray L2 while the second upper semiconductor layer 24 is arranged at a top of the second light emitting layer 23 and the second reflective layer 26 is mounted on a top of the second upper semiconductor layer 24. The second passivation layer 28 is disposed on a top of the second reflective layer 26 and covering one side of the second upper semiconductor layer 24 and the other part of the second lower semiconductor layer 22 while the second electrode 29 is inserted through the second passivation layer 28 and the second reflective layer 26 and electrically connected with the second upper semiconductor layer 24. In this embodiment, the second passivation layer 28 is covering one side of the second reflective layer 26 and one side of the second light emitting layer 23 correspondingly. In this embodiment, the second lower semiconductor layer 22 is extending while the second light emitting layer 23 and the second upper semiconductor layer 24 are not extending correspondingly so as to form the groove 222 (as shown in FIG. 2). The second common electrode 34 is inserted through the second passivation layer 28 and electrically connected with the second lower semiconductor layer 22.

The third light emitting unit 40 includes a third lower semiconductor layer 42, a third light emitting layer 43, a third upper semiconductor layer 44, a third electrode 49 and a third common electrode 36. The third lower semiconductor layer 42 is located above the second passivation layer 28 with an interval therebetween and electrically connected with the third common electrode 36. The third light emitting layer 43 is disposed on a top of the third lower semiconductor layer 42 and emitting a third light ray L3 while the third upper semiconductor layer 44 is mounted on a top of the third light emitting layer 43. The third electrode 49 is electrically connected with the third upper semiconductor layer 44 while the third common electrode 36 is electrically connected with the third lower semiconductor layer 42.

A first connection point 52, a second connection point 54, a third connection point 56, and a common connection point 58 are disposed on a bottom of the substrate 50 and spaced apart from one another. The first connection point 52, the second connection point 54, the third connection point 56 are respectively electrically connected with the second electrode 29, the first electrode 19, and the third electrode 49 while the common connection point 58 is electrically connected with the first common electrode 32, the second common electrode 34, and the third common electrode 36. In this embodiment, the third light emitting unit 40 is located on one side of the first light emitting unit 10 correspondingly so that the third light ray L3 is emitted from the light emitting surface alone (as shown in FIG. 6).

In this embodiment, the third light emitting unit 40 is a flip chip LED.

In this embodiment, the groove 222 is formed by extension of the second lower semiconductor layer 22 which is electrically connected with the second common electrode 34. The above design keeps the first common electrode 32, the second common electrode 34, and the first electrode 19 from interfering one another.

In a preferred embodiment, the first lower semiconductor layer 12, the second lower semiconductor layer 22, and the third lower semiconductor layer 42 are N-type semiconductor layers while the corresponding the first upper semiconductor layer 14, the second upper semiconductor layer 24, and the third upper semiconductor layer 44 are P-type semiconductor layers, but not limited.

In a preferred embodiment, a transparent substrate 60 is disposed on a bottom of the first lower semiconductor layer 12. The first light ray L1 and the second light ray L2 are respectively passed through the transparent substrate 60 while the third light ray L3 of this embodiment is passed by one side of the transparent substrate 60.

In this embodiment, the first common electrode 32 is inserted through the first passivation layer 18 and electrically connected with the first lower semiconductor layer 12 while the second common electrode 34 is inserted through the second passivation layer 28 and electrically connected with the second lower semiconductor layer 22.

Still refer to FIG. 4, FIG. 5, and FIG. 6, in this embodiment, the first light emitting layer 13 emits the first light ray L1. A part of the first light ray L1 is passed through the first lower semiconductor layer 12 while the other part of the first light ray L1 is emitted to the first reflective layer 16 to be reflected by the first reflective layer 16 and emitted from the first lower semiconductor layer 12. The second light ray L2 is emitted from the second light emitting layer 23 and a part of the second light ray L2 is passed through the second lower semiconductor layer 22, the first passivation layer 18, the first reflective layer 16, the first upper semiconductor layer 14, the first light emitting layer 13, and the first lower semiconductor layer 12. The other part of the second light ray L2 is emitted to the second reflective layer 26 to be reflected by the second reflective layer 26 and emitted from the first lower semiconductor layer 12. The third light emitting layer 43 emits the third light ray L3 which is directly passed through the third lower semiconductor layer 42.

In this embodiment, the first light ray L1 is red light, green light, or blue light. Similarly, the second light ray L2 and the third light ray L3 are red light, green light or blue light. For example, the first light ray L1 is green light, the second light ray L2 is blue light, and the third light ray L3 is red light, but not limited.

The relationship of other components of this embodiment is the same as the first embodiment mentioned above, thus will not be described here.

In this embodiment, an area (light emitting surface) of the micro LED 1 is further reduced by fewer connection points.

In summary, a micro LED of the present invention includes two light emitting units stacked each other and respectively electrically connected with a substrate by electrodes. One more light emitting unit is provided and electrically connected with the substrate by an electrode. The three light emitting units are connected with the same connection point of the substrate by common electrodes Thereby an area of a light emitting surface is reduced by fewer connection points and the vertically-stacked light emitting units. The problem of difficulty in area reduction of conventional micro LED can be solved.

Therefore, the present invention which is novel, non-obvious, and useful meets major requirements for patentability.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalent.

The invention claimed is:

1. A micro light emitting diode comprising:

a first light emitting unit which includes a first lower semiconductor layer, a first light emitting layer disposed on a top of the first lower semiconductor layer and emitting a first light ray, a first upper semiconductor layer arranged at a top of the first light emitting layer, a first reflective layer mounted on a top of the first upper semiconductor layer, a first passivation layer disposed on a top of the first reflective layer and covering the first upper semiconductor layer, and a first electrode inserted through the first passivation layer and the first reflective layer and electrically connected with the first upper semiconductor layer;

a second light emitting unit which includes a second lower semiconductor layer disposed on a top of the first passivation layer and provided with a groove in which the first electrode is mounted and located at an inner side thereof, a second light emitting layer arranged at a top of a part of the second lower semiconductor layer and emitting a second light ray, a second upper semiconductor layer mounted on a top of the second light emitting layer, a second reflective layer arranged at a top of the second upper semiconductor layer, a second passivation layer disposed on a top of the second reflective layer and covering one side of the second upper semiconductor layer and the other part of the second lower semiconductor layer, and a second electrode inserted through the second passivation layer and the second reflective layer and electrically connected with the second upper semiconductor layer;

a common electrode electrically connected with the first lower semiconductor layer and the second lower semiconductor layer;

a third light emitting unit which includes a third lower semiconductor layer located above the second passivation layer with an interval therebetween and electrically connected with the common electrode, a third light emitting layer disposed on a top of the third lower semiconductor layer and emitting a third light ray, and a third upper semiconductor layer mounted on a top of the third light emitting layer; and a substrate having a first connection point, a second connection point, a third connection point, and a common connection point which are disposed on a bottom of the substrate and spaced apart from one another while the first connection point, the second connection point, the third connection point, and the common connection point are respectively electrically connected with the second electrode, the first electrode, the third upper semiconductor layer, and the common electrode;

wherein the third light emitting unit is located above the first light emitting unit so that the third light ray is passed through the first light emitting unit.

2. The micro LED as claimed in claim 1, wherein a transparent substrate is arranged at a bottom of the first lower semiconductor layer.

3. The micro LED as claimed in claim 1, wherein the first light ray is selected from the group consisting of red light, green light, and blue light.

4. The micro LED as claimed in claim 1, wherein the second light ray is selected from the group consisting of red light, green light, and blue light.

5. The micro LED as claimed in claim 1, wherein the third light ray is selected from the group consisting of red light, green light, and blue light.

6. A micro light emitting diode comprising:

a first light emitting unit which includes a first lower semiconductor layer, a first light emitting layer disposed on a top of the first lower semiconductor layer and emitting a first light ray, a first upper semiconductor layer arranged at a top of the first light emitting layer, a first reflective layer mounted on a top of the first upper semiconductor layer, a first passivation layer disposed on a top of the first reflective layer and covering the first upper semiconductor layer, a first electrode inserted through the first passivation layer and the first reflective layer and electrically connected with the first upper semiconductor layer, and a first common electrode inserted through the first passivation layer and electrically connected with the first lower semiconductor layer;

a second light emitting unit which includes a second lower semiconductor layer disposed on a top of the first passivation layer and provided with a groove in which the first electrode is mounted and located at an inner side thereof, a second light emitting layer arranged at a top of a part of the second lower semiconductor layer and emitting a second light ray, a second upper semiconductor layer mounted on a top of the second light emitting layer, a second reflective layer arranged at a top of the second upper semiconductor layer, a second passivation layer disposed on a top of the second reflective layer and covering one side of the second upper semiconductor layer and the other part of the second lower semiconductor layer, a second electrode inserted through the second passivation layer and the second reflective layer and electrically connected with the second upper semiconductor layer, and a second common electrode inserted through the second passivation layer and electrically connected with the second lower semiconductor layer;

a third light emitting unit which includes a third lower semiconductor layer located above the second passivation layer with an interval therebetween, a third light emitting layer disposed on a top of the third lower semiconductor layer and emitting a third light ray, a third upper semiconductor layer mounted on a top of the third light emitting layer, a third electrode electrically connected with the third upper semiconductor layer, and a third common electrode electrically connected with the third lower semiconductor layer; and a substrate having a first connection point, a second connection point, a third connection point, and a common connection point which are disposed on a bottom of the substrate and spaced apart from one another; the first connection point, the second connection point, and the third connection point are respectively electrically connected with the second electrode, the first electrode, and the third electrode while the common connection point is electrically connected with the first common electrode, the second common electrode, and the third common electrode;

wherein the third light emitting unit is disposed on one side of the first light emitting unit and the common connection point is arranged above the first light emitting unit.

7. The micro LED as claimed in claim 6, wherein a transparent substrate is arranged at a bottom of the first lower semiconductor layer.

8. The micro LED as claimed in claim 6, wherein the first light ray is selected from the group consisting of red light, green light, and blue light.

9. The micro LED as claimed in claim 6, wherein the second light ray is selected from the group consisting of red light, green light, and blue light.

10. The micro LED as claimed in claim 6, wherein the third light ray is selected from the group consisting of red light, green light, and blue light.

\* \* \* \* \*